United States Patent [19]

Kirayoglu et al.

[11] Patent Number: 5,223,094
[45] Date of Patent: Jun. 29, 1993

[54] PROCESS FOR PREPARING STRONG AROMATIC POLYAMIDE PAPERS OF HIGH POROSITY

[75] Inventors: Birol Kirayoglu, Wilmington, Del.; William J. Sullivan, Richmond, Va.

[73] Assignee: E. I. Du Pont de Nemours and Company, Wilmington, Del.

[21] Appl. No.: 882,531

[22] Filed: May 13, 1992

[51] Int. Cl.$^5$ ............................................. D21H 13/26
[52] U.S. Cl. ................... 162/145; 162/146; 162/157.3; 162/206; 162/207
[58] Field of Search ............... 162/146, 145, 157.3, 162/206, 207

[56] References Cited

U.S. PATENT DOCUMENTS

| 3,756,908 | 9/1973 | Gross | 162/157.3 |
| 4,519,873 | 5/1985 | Amano et al. | 162/138 |
| 4,775,580 | 10/1988 | Dighton | 162/145 |
| 4,897,301 | 1/1990 | Uno et al. | 428/209 |
| 4,992,141 | 2/1991 | Sullivan | 162/157.3 |
| 5,089,088 | 2/1992 | Hendren et al. | 162/157.3 |

FOREIGN PATENT DOCUMENTS 62-41400 2/1987 Japan .

OTHER PUBLICATIONS

Research Disclosure, Dec. 1979, p. 674.

*Primary Examiner*—Peter Chin

[57] ABSTRACT

Papers with improved tensile strength and increased porosity are obtained by heat treatment of calendered sheets of poly(p-phenylene terephthalamide) short fibers and poly(m-phenylene isophthalamide) fibrids.

3 Claims, No Drawings

PROCESS FOR PREPARING STRONG AROMATIC POLYAMIDE PAPERS OF HIGH POROSITY

BACKGROUND OF THE INVENTION

Papers containing aramid floc and fibrids with or without special ingredients such as quartz fiber have been proposed for use as substrates for electronic printed wiring boards. This end-use places a number of demands on the substrates, such as good mechanical properties along with high porosity to make it easier to impregnate with resins. Papers of this type are generally prepared by a wet process using a papermaking machine. The wet-laid sheets are drained, dried and calendered. The resulting papers are of limited strength and porosity. The process of the present invention upgrades the tensile properties of the calendered product while increasing its porosity.

SUMMARY OF THE INVENTION

This invention provides a process for increasing the tensile strength and porosity of calendered paper consisting essentially of from 45 to 97 weight % of poly(p-phenylene terephthalamide) floc, from 3 to 30 weight % of poly(m-phenylene isophthalamide) fibrids and from 0–35 weight % of quartz fiber, comprising heating the paper, free of applied pressure, at a temperature of at least 480° F., for at least 12 seconds but no more than 100 seconds, preferably at least 510° F. for 20 to 30 seconds.

DETAILED DESCRIPTION OF THE INVENTION

In the wet forming process of making papers to be treated in accordance with the present invention, an aqueous slurry of short fibers, under 0.5 inches long of poly(p-phenylene terephthalamide) (PPD-T) and fibrids of poly(m-phenylene isophthalamide) (MPD-I) and optionally, other short fibers is prepared and a sheet is formed from the slurry using a paper making machine. The sheet is dried and calendered before being subjected to the process of the invention.

More specifically, an aqueous slurry is prepared which contains between 0.005% and 0.02% by weight of solids which comprise from 45 to 97% by weight of short (less than 0.5 inch long) fibers of PPD-T, 3 to 30% by weight of MPD-I fibrids and 0 to 35% by weight of short (less than 0.5 inch long) quartz fibers. It is important that the fibrids not exceed 30 wt. %. The use of greater amounts of MPD-I fibrids in the sheet results in increased moisture absorption and higher shrinkage, both undesirable qualities in printed circuit board applications. A sheet is formed from the slurry using a paper making machine. After drying the sheet has a basis weight between about 0.8 and about 4 oz/yd$^2$. The dried sheet is then calendered before heat treatment in accordance with the present invention. Heat treatment of the sheet at temperatures above 500° F. before calendering may crystallize the fibrids of the sheet thereby preventing adequate sheet densification and control of sheet thickness uniformity by operation of the calender.

Calendering is a high speed operation designed to reduce sheet thickness and improve surface smoothness. For such purposes the calender is normally operated at temperatures below 500° F. with little residence time. Calenders which can be operated at significantly higher temperatures are more costly and are not generally available. The process of this invention renders use of such high temperature calenders unnecessary and yet provides some improvement over their use.

The heat treatment of this invention is conveniently accomplished by passing the sheet through an oven at a designated linear speed. The sheet is pulled through the oven at a tension sufficient to avoid wrinkles. No pressure is applied to the sheet while it is heated in an oven. The heating temperature and residence time are inversely related with lower temperatures generally requiring greater residence time and higher temperatures permitting shorter residence times to achieve maximum tenacity. At a temperature of 480° F., the residence time should be at least 12 seconds to obtain a noticeable improvement. Temperatures of at least 510° F. at residence time of 20 to 30 seconds are preferred conditions because they achieve most of the benefit resulting from the invention. No material advantage is gained by further substantial increases in residence time and/or by use of substantially higher temperatures. Such conditions, e.g., residence times greater than 100 seconds, adversely affect the economics of the process and increase the chances of polymer degradation. The preferred sheets of the invention consist essentially of 70 to 97 wt. % PPD-T floc and 3 to 30 wt. % MPD-I fibrids. The resulting sheets have excellent thickness uniformity across their width.

Test and Measurements

The test procedures used to measure paper properties are as follows:

| | |
|---|---|
| Thickness | = ASTM Method D-374 |
| Tensile Strength | = ASTM Method D-1682-75 |
| Elmendorf Tear | = ASTM Method D-689 |
| Gurley Hill Porosity | = TAPPI Method T 460m-49 |

EXAMPLE 1

The precursor papers employed in this example were composed of poly(p-phenylene terephthalamide) short fibers (92% by weight) and poly(m-phenylene isophthalamide) fibrids (8% by weight). The papers were calendered between a heated (500° F.) hard surface roll and a resilient deformable roll under a pressure of 357 kg/cm at a line speed of 25 yards per minute. The calendered sheets, other than the control, were heat treated, free of applied pressure, for various periods at various temperatures by passage through an oven. The speed at which the sheet passed through the oven determined residence time. The temperature was determined just before it leaves the oven.

The conditions of heat treatment and measurements made on the control and the heat treated products are presented in Table 1, below.

TABLE 1

| | Control | A | B | C | D | E |
|---|---|---|---|---|---|---|
| Heat Treatment | | | | | | |
| Temp. F. | — | 560 | 560 | 510 | 510 | 480 |
| Speed (fpm) | — | 12 | 35 | 8 | 16 | 16 |
| Res. Time (sec) | — | 45 | 13.7 | 60 | 30 | 30 |
| Basis Wt. (oz/yd$^2$) | 1.68 | 1.63 | 1.63 | 1.58 | 1.63 | 1.60 |
| Thickness (mils) | 2.90 | 3.19 | 2.98 | 3.23 | 2.94 | 2.97 |
| Density (g/cc) | 0.78 | 0.68 | 0.73 | 0.66 | 0.74 | 0.72 |
| Ten. Str. (lb/in) | | | | | | |
| MD* | 7.6 | 16.9 | 10.9 | 14.1 | 13.8 | 11.6 |
| XD** | 6.0 | 13.7 | 9.6 | 12.5 | 11.7 | 9.7 |
| Elongation (%) | | | | | | |

TABLE 1-continued

|  | Control | A | B | C | D | E |
|---|---|---|---|---|---|---|
| MD | 0.85 | 1.28 | 1.16 | 1.28 | 1.20 | 1.16 |
| XD | 0.69 | 1.25 | 1.11 | 1.24 | 1.21 | 1.08 |
| WTB (in-lb/in²) | | | | | | |
| MD | 0.04 | 0.11 | 0.07 | 0.09 | 0.09 | 0.07 |
| XD | 0.02 | 0.08 | 0.06 | 0.08 | 0.07 | 0.06 |
| ElmTear (gm) | | | | | | |
| MD | 87 | 78 | 110 | 91 | 100 | 118 |
| XD | 76 | 68 | 100 | 88 | 90 | 96 |
| Gurley Hill Porosity (sec) | 88 | 20 | 25 | 19 | 23 | 27 |

MD* = machine direction
XD** = cross-machine direction

It is seen from the above that the heat treatment process of the invention has increased tenacity, elongation, work to break (WTB) and Elmendorf Tear (ElmTear) while lowering density and increasing porosity.

EXAMPLE 2

The paper (sheets) used in this example were prepared as described above from poly(p-phenylene terephthalamide) short fiber, poly(m-phenylene isophthalamide) fibrids and in one case, quartz fibers. The proportions of the ingredients and the calendering conditions are given in Table 2 below. Calender type A was similar to that employed in Ex. 1, while in calendar type B, both rolls were hard surface rolls.

The calendered papers, except for the controls, were then heat treated by passage through or as hand sheets in an oven with temperature and residence time varied as shown in Table 2. The heat treated papers and the controls were measured for basis weight, thickness, tensile strength, elongation, work-to-break, Elmendorf Tear strength and porosity. The values obtained are given in Table 2.

TABLE 2

|  | Item 1 | Item 2 | Item 3 |
|---|---|---|---|
| Paper Composition | | | |
| % Short Fibers | 88 | 75 | 97 |
| % Fibrids | 12 | 25 | 3 |
| Calendering | | | |
| Type | B | A | A |
| Temp. C. | 145 | 260 | 260 |
| Pressure (Kg/cm) | 2708 | 357 | 357 |
| Line Speed (ypm) | 20 | 25 | 25 |

|  | Control | Item 1A | Control | Item 2A | Control | Item 3A |
|---|---|---|---|---|---|---|
| Heat Treatment | | | | | | |
| Temp °F. | — | 627–671 | — | 590 | — | 644 |
| Speed (fpm) | — | 2.5 | — | 13.4 | — | 7.25 |
| Time (sec) | — | 96 | — | 18 | — | 33 |
| B.W. (oz/yd²) | 1.73 | 1.75 | 0.90 | 0.87 | 4.13 | 4.13 |
| Thick (mils) | 2.16 | 2.41 | 1.90 | 2.57 | 7.85 | 8.90 |
| Density (g/cc) | 1.07 | 0.97 | 0.63 | 0.45 | 0.70 | 0.62 |
| Ten. Str. (lb/in) | | | | | | |
| MD | 11.3 | 20.9 | 5.8 | 12.4 | 9.5 | 21.0 |
| XD | 9.0 | 16.1 | 3.9 | 9.8 | 4.9 | 15.1 |
| Elong. (%) | | | | | | |
| MD | 0.8 | 1.3 | 1.2 | 1.3 | 1.1 | 1.5 |
| XD | 0.7 | 1.4 | 1.0 | 1.8 | 1.1 | 1.9 |
| WTB (in-lb/in²) | | | | | | |
| MD | 0.04 | 0.13 | | | | |
| XD | 0.03 | 0.11 | | | | |
| Elm Tear (gm) | | | | | | |
| MD | 59 | 81 | 94 | 121 | 188 | 206 |
| XD | 60 | 72 | 92 | 109 | 155 | 126 |
| Gurley Hill Porosity (sec) | 91.5 | 28.5 | 1.6 | 0.2 | 2.3 | 1.7 |

The data shown in Table 2 show clearly that heat treatment significantly increases the mechanical properties (tensile, elongation, WTB, tear) of the paper as well as increasing its thickness (reducing its density) and increasing its porosity (lower number means more porous) to make it easier to impregnate.

Improvement in tensile strength upon heat treatment has also been observed with calendered sheets containing quartz fiber. For example a calendered sheet from 48% by weight of short poly(p-phenylene terephthalamide) fiber, 20% by weight of poly(m-phenylene isophthalamide) fibrids and 32% by weight of quartz fiber showed an improvement of from 2.7 to 5.4 lb/in in MD tensile strength when heated at 599° F. for 30 seconds.

We claim:

1. A process for increasing the tensile strength and porosity of calendered paper consisting essentially of from 45 to 97 weight % of poly(p-phenylene terephthalamide) short fiber, from 3 to 30 weight % of (m-phenylene isophthalamide) fibrids and from 0 to 35 weight % of quartz fiber, comprising heating the paper, free of applied pressure, at a temperature of at least 480° F. and for a period of at least 12 seconds but no more than 100 seconds.

2. A process according to claim 1 wherein the paper consists essentially of from 70 to 97% by weight of the short poly(p-phenylene terephthalamide) fiber and from 3 to 30% by weight of the fibrids.

3. A process according to claim 1 wherein the paper is heated at least 510° F. for from 20 to 30 seconds.

* * * * *